Sept. 28, 1965 C. W. MUELLER 3,208,924

SEMICONDUCTOR DEVICES

Filed March 17, 1961 2 Sheets-Sheet 1

INVENTOR.
CHARLES W. MUELLER
BY
W.S. Hill
AGENT

Sept. 28, 1965 C. W. MUELLER 3,208,924

SEMICONDUCTOR DEVICES

Filed March 17, 1961 2 Sheets-Sheet 2

INVENTOR.
CHARLES W. MUELLER
BY
W.S. Hill
AGENT

United States Patent Office 3,208,924
Patented Sept. 28, 1965

3,208,924
SEMICONDUCTOR DEVICES

Charles W. Mueller, Princeton, N.J., assignor to Radio Corporation of America, a corporation of Delaware Filed Mar. 17, 1961, Ser. No. 96,422
9 Claims. (Cl. 204—143)

This invention relates to an improved method of making improved semiconductor devices. More particularly, it relates to an improved method of making semiconductor devices such as diodes, which include a rectifying junction.

In the fabrication of semiconductor junction devices it is often important to control the area of the rectifying junction. For example, in tunnel diodes it is desirable to reduce the area of the P-N junction in order to decrease peak current and control the peak-to-valley current ratio of the device. For a discussion of tunnel diode parameters such as peak current, valley current,, and the like, see article by H. S. Sommers Jr., "Tunnel Diodes as High Frequency Devices," Proc. IRE, July 1959.

Semiconductor devices such as diodes and the like have been made by alloying a pellet of electrode material which induces given conductivity type to the surface of a semiconductor wafer of opposite conductivity type. The pellet melts during the alloying process, and dissolves a portion of the semi-conductor wafter material. When the pellet-wafer assemblage is cooled, the dissolved wafer material precipitates as an extension of the wafer crystal lattice. The precipitated region contains a sufficient amount of the pellet conductivity type-determining material to be converted to said given conductivity type. A rectifying P-N junction is thus formed between the given conductivity type precipitated region and the opposite conductivity type bulk of the wafer. In order to reduce the area of the P-N junction thus produced, smaller electrode pellets are often utilized. However, electrode pellets smaller than 5 mils in diameter are difficult to handle in mass production. Furthermore, it is difficult to attach an electrical lead to such small pellets.

It is an object of this invention to provide an improved method of making improved semiconductor junction devices.

Another object is to provide an improved method of controlling the area of a P-N junction.

Still another object is to provide an improved method of making improved tunnel diodes.

But another object is to provide an improved method of controlling the peak current in tunnel diodes.

These and other objects of the invention are accomplished by preparing a given conductivity type semiconductive wafer with two opposing major faces and a surface zone of opposite conductivity type on one major face. An electrode pellet is attached to the opposite conductivity type surface zone so that the pellet makes an ohmic contact to the zone. The surface zone of the wafer is then removed except for at least part of the portion immediately beneath the electrode pellet.

Figure 5:
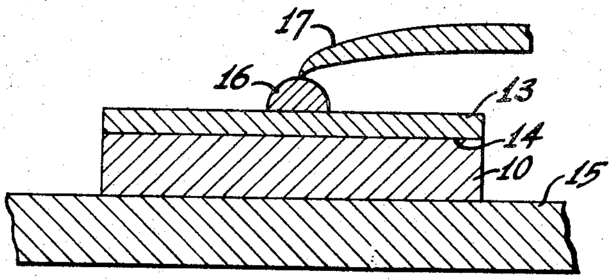
Figure 6:
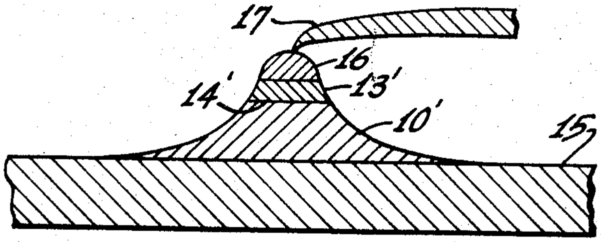
Figure 7:
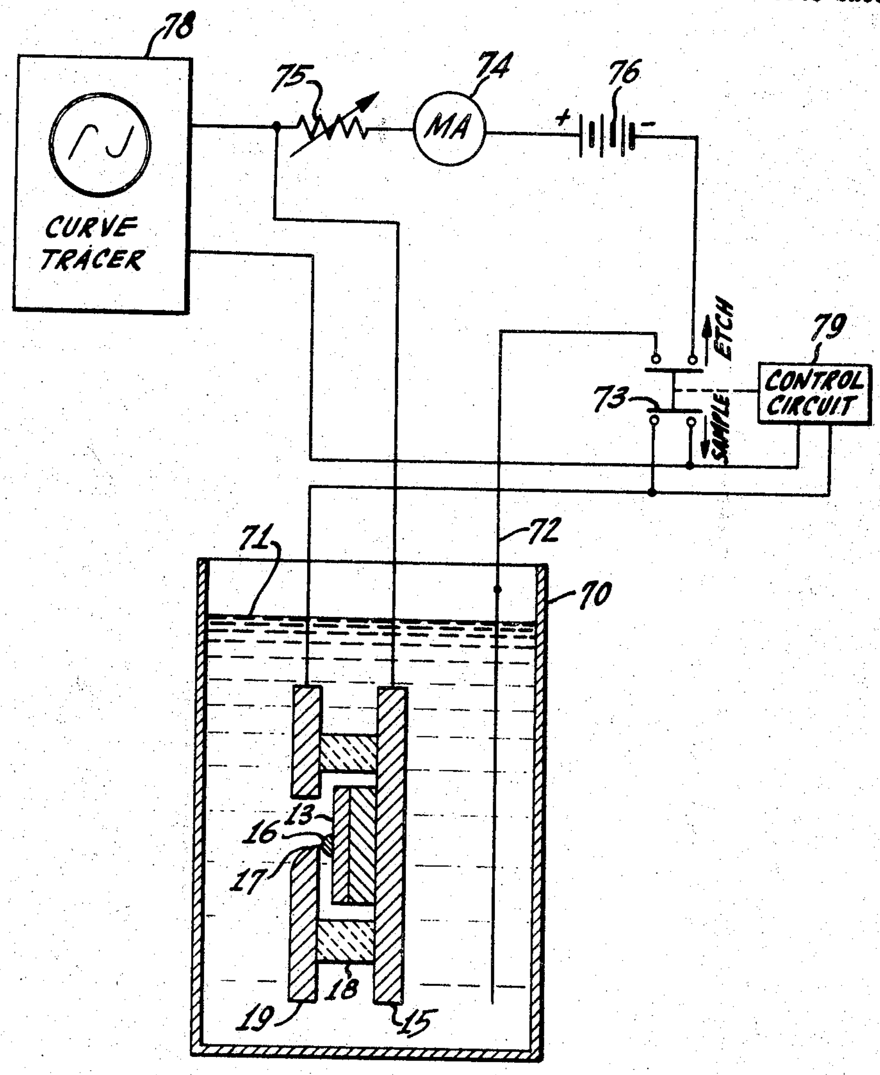

The invention and its advantages will be described in greater detail in connection with the accompanying drawing, in which:

FIGURES 1–6 are cross-sectional views illustrating successive steps in the fabrication of a semiconductor device according to the invention; and, FIGURE 7 is a schematic view of a method of etching a semiconductor junction device according to one embodiment of the invention.

The invention will be described in connection with the fabrication of a germanium tunnel diode, but it will be understood that the invention is equally applicable to other crystalline semiconductive materials, such as silicon, germanium-silicon alloys, and semiconductive compounds such as indium phosphide, gallium arsenide, and the like. The conductivity type of the different regions of the device may be reversed. Furthermore, the other types of semiconductor junction devices, including two-terminal devices such as conventional diodes and PNPN diodes, three-terminal devices such as triode transistors and unipolar transistors, and four-terminal devices such as tetrodes, may be similarly fabricated with a junction of controllably reduced area by the method of this invention.

*Example*

Figure 1:
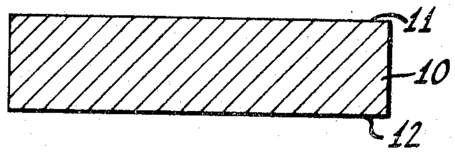
Figure 2:
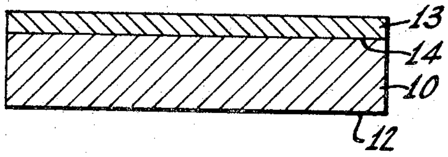

A crystalline semiconductive wafer 10 of given conductivity type is prepared with two opposing major faces 11 and 12, as shown in FIG. 1. The exact size, shape, material, and doping of wafer 10 is not critical in the practice of the invention, and is adjusted for the particular application desired.

A thin surface zone 13 of wafer 10 adjacent to one major face 11 is converted to opposite conductivity type by any convenient method, for example, by diffusion of an opposite conductivity type-determining material into face 11 of wafer 10. A rectifying barrier or junction 14 is thus formed between surface zone 13 and the bulk of wafer 10.

In this example, wafer 10 consists of P-type germanium, and contains sufficient gallium to have about $8\times10^{19}$ to $5\times10^{20}$ charge carriers per cm.$^3$. Wafer 10 may suitably be 25 mils square and 2 mils thick. Since the bulk of wafer 10 is P-type, the surface zone 13 must be converted to N-type conductivity by the incorporation of suitable donors. Surface zone 13 may conveniently be formed by flooding face 11 of wafer 10 with a melt (not shown) consisting of 50 gms. tin-lead solder and 2 gms. germanium arsenide. A portion of the semiconductive wafer material is thus dissolved from face 11 of wafer 10. On cooling the melt, this dissolved wafer material, together with some of the arsenic of the melt, is deposited on wafer face 11 in the form of an N-type surface layer 13. The melt is then decanted from the wafer. The thin arsenic-containing N-type zone 13 thus formed in wafer 10 is advantageously of the order of 0.1 mil in thickness.

Figure 3:
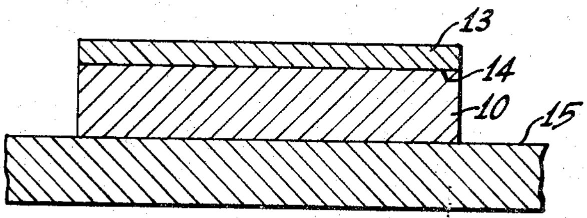

Wafer 10 is now bonded to a metallic support 15, so that surface zone 13 is uppermost, as shown in FIG. 3. The support 15 is preferably made of a metal or alloy which is sufficiently inert to withstand the action of any etchants subsequently utilized. In this example, the support 15 consists of a gold-plated alloy of nickel-iron-cobalt, such as Kovar, Fernico, and the like.

Figure 4:
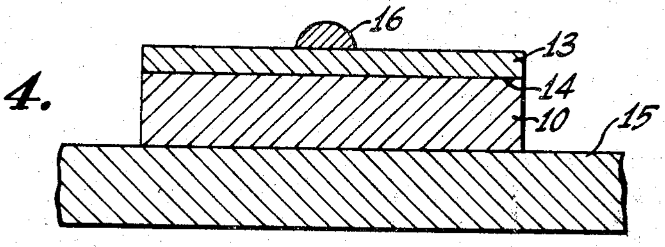

Referring now to FIG. 4, an electrode pellet or dot 16 is attached to N-type zone 13 by fusing or surface alloying. The pellet or dot 16 may be made of material which is electrically inert with respect to wafer 10. In this example, lead, tin, and lead-tin alloy may be utilized for the electrode 16, since these materials are electrically inert with respect to germanium. Alternatively, the electrode dot 16 may consist of or contain donor material which induces the same conductivity as surface zone 13.

In this example, since zone 13 is N-type, the dot 16 may consist of lead and a small amount of a donor such as antimony. The connection between pellet 16 and surface zone 13 of wafer 10 is thus ohmic in character.

Next, an electrical connection is made to electrode dot 16, for example, as shown in FIG. 5, by means of a metal point 17, which advantageously is made of the same metal or alloy as support 15. The electrical connection 17 is particularly useful when the device is subsequently electrolytically etched. The surface zone 13 of wafer 10 is then removed, except for at least part of the portion of zone 13 which is immediately beneath electrode 16, leaving the etched wafer 10' with a surface zone 13' of reduced surface area, and hence a junction 14' of reduced area, as shown in FIG. 6. The removal of a portion of surface zone 13 may be accomplished, for example, by chemical etching, or more conveniently by electrolytic etching as described below. If desired, prolonged etching may be utilized to undercut the portion of wafer 10 immediately beneath electrode 16, so that the remaining junction area 14' is less than the area of electrode 16.

One method of controllably reducing the area of junction 14 in wafer 10 is shown in FIG. 7. The support 15 for the wafer 10 and the electrical connection to dot 16 may conveniently be united by means of an insulating ring 18 to form a low-capacitance low-impedance mount or case, as described in my application Serial No. 844,663, filed October 6, 1959, now U.S. Patent No. 3,001,113, and assigned to the assignee of the instant invention. The connection 17 to electrode 16 consists of an apertured metal plate 19 having a prong or lobe 17 within its aperture. The prong 17 is bent within the aperture to form the connection to electrode pellet 16. The assemblage of the wafer 10 and its support or case is immersed in an etching tank 70 containing a suitable etchant 71 and a cathode 72, which may, for example, be platinum or carbon. The etching bath in this example consists of a 40 weight percent aqueous solution of potassium hydroxide. The wafer 10 and its mount or support is connected as the anode of the etching bath. The etching circuit also includes a double-pull double-throw switch 73, having a center "off" position, a milliameter 74, and a variable resistance or rheostat 75 in series with a source of direct current, such as a battery 76. A curve tracer 78 having its own power supply is connected between plates 15 and 19 of the device case.

In operation, the switching circuit is energized by periodically closing switch 73 for short periods of time, of the order of 20 seconds. The current through the semiconductor device is adjusted by means of the variable resistance 75 to be about 250 milliamperes at the beginning of the etching cycle. After each period of etching, switch 73 is thrown in the opposite direction so that the peak current of the device can be read on curve tracer 78. This cycle of etching the unit and reading the peak current is repeated a number of times, during which the variable resistance 75 is adjusted so that the etching current is gradually decreased to about 20 milliamperes. When the peak current, as measured on curve tracer 78, is reduced to the desired value, for example 5 milliamperes, the etching process is halted. The entire etching cycle may thus be completed in a few minutes. The device is then removed from the etching bath, washed in deionized water, dried, and hermetically sealed.

Tunnel diodes thus fabricated have exhibited a current density of 80,000 amperes/cm.$^2$, and a figure of merit of 40 kilomegacycles. The figure of merit for a tunnel diode is equal to $1/2\pi RC$, where R is the negative resistance of the diode in ohms and C is the capacitance of the junction in farads.

One of the advantages of this method of fabricating semiconductor devices is that the dot or pellet 16 is merely an ohmic connection to the surface zone 13, and hence the dot can be placed anywhere on surface zone 13, thus avoiding the problems of precise location of the dot which occur when the dot contains a conductivity type-determining material and forms a junction with the wafer.

Another advantage of this method is that the composition of the dot can be readily varied to give the desired mechanical properties of strength and resistance for elevated temperatures, since it is not necessary for a doping agent to be present in the dot. For example, when the semiconductive wafer is of N-conductivity type germanium or silicon, and the electrode pellet or dot 16 is employed to form an alloyed PN junction, the use of low-melting acceptors, such as indium and gallium, limits the maximum operating temperature of the device. In contrast, in the method of this invention, a P-type region or zone may be formed on an N-type wafer, and the pellet 16 allowed to the P-type zone may consist of lead or gold, which will withstand higher temperatures than indium.

Various modifications and variations may be made without departing from the spirit and scope of the invention. For example, the ohmic contact material 16 may be deposited on surface zone 13 by evaporation. Instead of preparing a wafer of given conductivity type and converting a surface zone thereof to opposite conductivity type, a thin slice of a semiconductive ingot may be treated to convert a zone adjacent one face of the slice to opposite conductivity type. The slice is then readily diced into a plurality of wafers. This procedure insures greater uniformity in the composition of the surface zone of the wafers.

Instead of switching the etching circuit on and off by hand, adjusting the variable resistance and observing the curve tracer until the desired value of peak current is attained, more sophisticated methods may be utilized to obtain automation of the etching process for mass production. An automatic control circuit 79 having its own power supply may be substituted for the curve tracer 78 and used to control switch 73. The control circuit 79 is preset to sample the diode current at periodic intervals with a constant current. If a unit having a peak current of 5 milliamperes is desired, the constant sampling current is set at 5 milliamperes. As long as the peak current is above 5 milliamperes, the voltage drop across the diode is about 80 to 100 millivolts. When the junction area of the diode has been sufficiently reduced to give a peak current of 5 milliamperes, the diode will switch to a higher voltage state in which the voltage drop across the diode is about 400 millivolts. The control circuit 79 is arranged so that this increase in voltage can keep switch 73 open and thus stop any further reduction in the area of the device junction.

What is claimed is:

1. The method of fabricating a semiconductor device comprising:

preparing a given conductivity type semiconductive wafer with two opposing major faces, a surface zone of opposite conductivity type on one entire major face, and a rectifying barrier between said surface zone and said wafer;

attaching an electrode to said surface zone so that said electrode makes an ohmic connection thereto;

removing from said one face all of said surface zone except for the portion immediately beneath said electrode; and removing a portion of said wafer around said electrode.

2. The method of fabricating a semiconductor device comprising:

preparing a given conductivity type semiconductive wafer with two opposing major faces, a surface zone of opposite conductivity type on one entire major face, and a rectifying barrier between said surface zone and said wafer;

bonding an electrode pellet to said surface zone so that said pellet makes an ohmic connection thereto;

electrolytically etching away from said one face all of said surface zone except for the portion immediately beneath said electrode pellet; and removing a substantial portion of said wafer from the entire said one face around said electrode pellet.

3. The method of preparing a semiconductor device comprising:

preparing a given conductivity type semiconductive wafer with two opposing major faces, a surface zone of opposite conductivity type on one entire major face, and a rectifying barrier between said surface zone and said wafer;

alloying an electrode pellet to said surface zone so that said pellet makes an ohmic connection thereto;

electrolytically etching away from said one face all of said surface zone except for the portion immediately beneath said electrode pellet; and electrolytically etching away a substantial portion of said wafer from the entire said one face around said electrode pellet.

4. The method of fabricating a semiconductor device comprising:

preparing a given conductivity type semiconductive wafer with two opposing major faces, a surface zone of opposite conductivity type on one entire major face, and a rectifying barrier between said surface zone and said wafer;

fusing an electrode pellet to said surface zone so that said pellet makes an ohmic connection thereto; immersing said wafer in an electrolytic etching bath and attaching said wafer to the anode of said bath;

electrolytically etching away from said one face all of said surface zone except for the portion immediately beneath said electrode pellet; and electrolytically etching away a substantial portion of said wafer from the entire said one face around said electrode pellet so that said one major face slopes downward from the periphery of said electrode pellet.

5. The method of fabricating a semiconductor device comprising:

preparing a given conductivity type semiconductive wafer with two opposing major faces, a surface zone of opposite conductivity type on one entire major face, and a rectifying barrier between said surface zone and said wafer;

evaporating on a portion of said surface zone a quantity of material capable of making an ohmic connection thereto; immersing said wafer in an electrolytic etching bath and attaching said wafer to the anode of said bath;

electrolytically etching away from said one face all of said surface zone except for the portion immediately beneath said evaporated material; and electrolytically etching away a substantial portion of said wafer from said one face around said evaporated material so that said one major face slopes downward from the periphery of said evaporated material to form a mesa including said evaporated material and the remainder of said rectifying barrier.

6. The method of fabricating a semiconductor device comprising:

preparing a given conductivity type semiconductive wafer with two opposing major faces, a surface zone of opposite conductivity type on one entire major face, and a rectifying barrier between said surface zone and said wafer;

bonding said wafer to a support so that said opposite type surface zone is uppermost;

attaching an electrode pellet to said surface zone so that said pellet makes an ohmic connection thereto; immersing said wafer in an electrolytic etching bath and attaching said wafer to the anode of said bath; and, electrolytically etching away said surface zone except for a portion thereof immediately beneath said electrode while monitoring the peak current of said junction of the device, the area of said remaining portion of said surface zone being reduced until a predetermined value of said peak current is attained.

7. The method of fabricating a tunnel diode comprising:

preparing a given conductivity type semiconductive wafer with two opposing major faces, a surface zone of opposite conductivity type on one entire major face, and a P-N junction between said surface zone and the remainder of said wafer;

bonding said wafer to a support so that said opposite type surface zone is uppermost;

alloying an electrode pellet to said surface zone so that said pellet makes an ohmic connection thereto; immersing said wafer in an electrolytic etching bath and attaching said wafer to the anode of said bath;

electrolytically etching away from said one face all of said surface zone except for a portion immediately beneath said electrode pellet and electrolytically etching away a substantial portion of said wafer from the entire said one face around said electrode pellet so that said one major face slopes downward from the periphery of said electrode pellet while monitoring the peak current of said junction, the area of said remaining portion of said surface zone being reduced until a predetermined value of said peak current is attained.

8. The method of fabricating a tunnel diode comprising:

preparing a given conductivity type germanium wafer with two opposing major faces, a surface zone of opposite conductivity type on one entire major face, and a rectifying barrier between said surface zone and the remainder of said wafer;

bonding the other one of said major faces of said wafer to a support;

attaching an electrode pellet selected from the group consisting of lead, tin, and lead-tin alloys to said surface zone so that said pellet makes an ohmic connection thereto;

immersing said wafer in an electrolytic etching bath and electrically connecting said wafer to the anode of said bath; and, electrolytically etching away said surface zone except for a portion thereof immediately beneath said electrode; and, electrolytically etching away a substantial portion of said wafer from the entire said one face around said electrode pellet so that said one major face slopes downward from the periphery of said electrode pellet.

9. The method of fabricating a tunnel diode comprising:

preparing a given conductivity type germanium wafer with two opposite major faces, a surface zone of opposite conductivity type on one entire major face, and a P-N junction between said surface zone and the remainder of said wafer;

bonding the other major face of said wafer to a support so that said opposite type surface zone is exposed;

alloying an electrode pellet selected from the group consisting of lead, tin and lead-tin alloys to said surface zone so that said pellet makes an ohmic connection thereto;

immersing said wafer in a potassium hydroxide etching bath and electrically connecting said wafer to the anode of said bath;

electrolytically etching away from said one face all of said surface zone except for a portion immediately beneath said electrode pellet, and monitoring the peak current of said junction while electrolytically etching away a substantial portion of said wafer from the entire one face around said electrode pellet so that one major face slopes downward from the periphery of said electrode pellet, the area of said remaining portion of said surface zone being reduced until a predetermined value of said peak current is attained.

References Cited by the Examiner

UNITED STATES PATENTS

| | | | |
|---|---|---|---|
| 2,757,323 | 7/56 | Jordan et al. | 204—143 |
| 2,783,197 | 2/57 | Herbert | 204—143 |
| 2,802,159 | 8/57 | Stump | 148—1.5 X |
| 2,975,342 | 3/61 | Rediker | 204—143 |
| 2,979,444 | 4/61 | Tiley | 204—143 |
| 3,088,888 | 5/63 | Leff | 204—143 |
| 3,110,849 | 11/63 | Soltys | 317—237 |

FOREIGN PATENTS

| | | |
|---|---|---|
| 1,228,285 | 3/60 | France. |
| 158,915 | 5/57 | Sweden. |

OTHER REFERENCES

Dunn: "Semiconductor Device Fabrication," IBM Technical Bulletin (II) 148-1.5, vol. 4, No. 7, December 1961.

IBM, "Etching PN Junctions, IBM Technical Disclosure Bulletin, vol. 2, No. 3, October 1959.

JOHN H. MACK, *Primary Examiner.*

MARCUS U. LYONS, *Examiner.*